United States Patent [19]

Waldsmith

[11] Patent Number: 5,448,817
[45] Date of Patent: Sep. 12, 1995

[54] CRYOGENIC REMOVAL OF SILICON SUBSTRATES FROM METALLIC HEAT SINKS USING THERMAL MASS TO COOL SURFACE MOUNTED PRINTED WIRE BOARDS

[75] Inventor: Gary R. Waldsmith, Pilot Hill, Calif.

[73] Assignee: The United States of America as represented by the Secretary of the Air Force, Washington, D.C.

[21] Appl. No.: 272,912

[22] Filed: Jun. 27, 1994

[51] Int. Cl.⁶ .............................. B23P 19/00
[52] U.S. Cl. .................. 29/426.5; 29/426.4; 156/344; 228/264
[58] Field of Search .............. 29/426.4, 426.5; 156/344; 228/264

[56] References Cited

U.S. PATENT DOCUMENTS

| | | | |
|---|---|---|---|
| 3,834,605 | 9/1974 | Coffin | 29/426.5 X |
| 3,837,815 | 9/1974 | Bixby | 23/293 R |
| 3,969,813 | 7/1976 | Minetti et al. | 29/426.5 X |
| 4,274,576 | 6/1981 | Shariff | 29/426.4 X |
| 4,603,345 | 7/1986 | Lee et al. | |
| 5,070,603 | 12/1991 | Waldsmith | 29/426.4 X |
| 5,199,159 | 4/1993 | Waldsmith | 29/426.4 X |
| 5,263,620 | 11/1993 | Hernandez et al. | 29/426.4 X |

Primary Examiner—Carl J. Arbes
Attorney, Agent, or Firm—Jacob N. Erlich; William G. Auton; Irwin P. Garfinkle

[57] ABSTRACT

The use of a liquid nitrogen ($LN_2$) bath to produce thermal stress between an aluminum heat sink and a silicon circuit board by deep cooling, makes it possible to separate each from the other product undamaged. This allows repair or replacement of the silicon substrate in a very short time with very little turn around time.

11 Claims, 1 Drawing Sheet

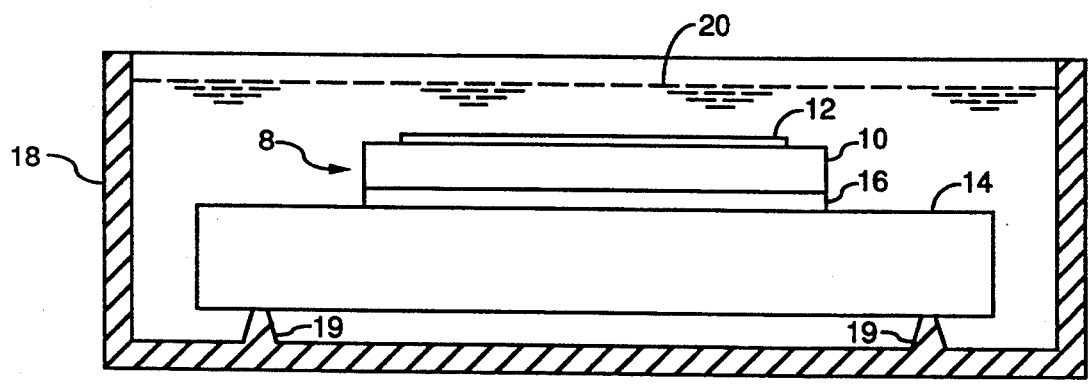

CRYOGENIC REMOVAL OF SILICON SUBSTRATES FROM METALLIC HEAT SINKS USING THERMAL MASS TO COOL SURFACE MOUNTED PRINTED WIRE BOARDS

STATEMENT OF GOVERNMENT INTEREST

The invention described herein may be manufactured and used by or for the Government for governmental purposes without the payment of any royalty thereon.

BACKGROUND OF THE INVENTION

In many applications, high density integrated circuit boards which develop a large amount of heat during operation require a large heat sink to assist in the efficient removal of the heat. As is common in the prior art, these integrated circuits are embedded in a silicon substrate circuit board. The purpose of this invention is to provide a method for removing a silicon substrate circuit board from the large aluminum heat sink needed to dissipate a large destructive heat load. In a practical case, the integrated circuit board comprised a 2.5 inch diameter flat silicon wafer substrate that is only 0.125 inches thick and very brittle. No methods for removing the wafer from the sink, without consistently damaging the wafer were known.

The silicon wafer is susceptible to chipping and cracking for a number of reasons. First, in the particular case, all circuit components were mounted on a single side utilizing surface mount technology, such as soldering and epoxy. In certain applications, due to the large amount of heat generated within a high density circuit, a gold/tin solder mix was used to ensure that the components would not come loose from the circuit board during operations. This solder has a relatively high melting point and does not enter the liquid phase until approximately 300° F. No prior art methods were known, and any attempt to remove a component to check the circuit out, generally resulted in a cracked or chipped and totally useless circuit board.

The following prior art U.S. Patents were reviewed after a search:

U.S. Pat. No. 5,199,159 issued to Waldsmith;
U.S. Pat. No. 5,070,603 issued to Waldsmith;
U.S. Pat. No. 4,603,345 issued to Lee et al; and
U.S. Pat. No. 3,837,815 issued to Bixby.

The Bixby patent relates to a method for separating a coating from the smooth surface of a base material. The temperature of the coated base metal is rapidly reduced to far below the freezing temperature of water. The coated surface is then wetted with a liquid which forms a frozen layer on the coated side of the base material. Heat is then applied to effect separation of the frozen layer from the base material, with the coating adhered to the separated frozen layer.

The Lee et al patent describes a module for a semiconductor chip, wherein the module includes a heat sink with a flat surface to which the back face of the semiconductor chip is directly bonded.

The Waldsmith patents '603 and '159 are my prior patents, and while they are relevant to cryogenic removal of components, none teaches the specific method of this invention.

SUMMARY OF THE INVENTION

This invention relates to integrated circuit boards, comprising electronic circuitry embedded in a thin silicon wafer substrates, which are mounted on large aluminum heat sinks, and comprises a method for removing the circuit boards from the heat sink without damaging or cracking the brittle wafer. This is accomplished by cooling the assembly including the wafer, the heat sink and the bonding material in liquid nitrogen (LN$_2$) bath. The separation of the board from the heat sink permits the testing and repairing of the circuits.

BRIEF DESCRIPTION OF THE DRAWING

For a clearer understanding of the invention, reference should now be made to the following detailed specification, and to the accompanying drawings, in which:

The single FIGURE shows a side view of a circuit board secured to a heat sink.

DETAILED DESCRIPTION OF A PREFERRED EMBODIMENT

The single FIGURE of the drawing shows an assembly 8 comprising a silicon substrate circuit board 10 with printed circuitry 12 secured thereto. The circuit board 10 is bonded to an aluminum heat sink 14 by means of epoxy 16. The purpose of this invention is to provide a method for removing a silicon substrate circuit board from the large aluminum heat sink 10 needed to dissipate a large destructive heat load produced by the operation of the printed circuitry. In a practical case, the integrated circuit board comprised a 2.5 inch diameter flat silicon wafer substrate that is only 0.125 inches thick and very brittle. The drawing shows the assembly 8 placed in a shallow container 18 on dimples 19, and immersed in liquid nitrogen (LN$_2$) 20 in preparation for separation of the circuit board 10 from the heat sink 14.

The silicon circuit board is susceptible to chipping and cracking for a number of reasons. First, in the particular case shown, all circuit components are mounted on a single side utilizing surface mount technology, such as soldering and epoxy. In certain applications, due to the large amount of heat generated within a high density circuit, a gold/tin solder mix is used to ensure that the electronic circuit components 12 would not come loose from the circuit board 10 during operations. This solder has a relatively high melting point and does not enter the liquid phase until approximately 300° F. No prior art methods were known, and any attempt to remove a component to check the circuit out, generally resulted in a cracked or chipped and totally useless circuit board.

The method for separating the circuit board 10 from the heat sink 14, without damaging the circuit board 10 or the electronic circuitry 12 comprised the following steps:

1. Separate the assembly 8 from any components on which it is mounted. In a particular case, this required the use of acetone to remove a conformal coating used on the phased arrays of an antenna system (not shown). The use of acetone requires adequate ventilation.
2. Pour the liquid nitrogen (LN$_2$) 20 from its storage Dewar container (not shown) into the shallow container 18 so that the liquid will completely cover the assembly 8 when placed in the container.

This will ensure that there will be an even temperature reduction and, therefore, no induced thermal stress on the fragile circuit board.

3. Place the assembly 8 in the shallow container 18, being careful not to splash the LN$_2$ around the workbench. Preferably, the assembly should be supported so that the liquid nitrogen completely surrounds it. Dimples 19 on the bottom of the container serve this purpose, but other methods are available.

4. Cool the assembly in the liquid nitrogen until the boiling of the LN$_2$ stops, at which time the cooling process is complete and the assembly is at its lowest temperature.

5. In the event the LN$_2$ level is reduced in depth as a result of boiling, add additional LN$_2$ to the shallow container to maintain the assembly 8 fully immersed. Note that this should be done before the LN$_2$ level drops below the circuit board 12. Keeping the assembly fully immersed reduces or eliminates thermal stress, and avoids cracking of the circuit board.

6. When the temperature has reached equilibrium, i.e., when the boiling of the LN$_2$ stops, remove the assembly from the container 18 and the LN$_2$. Note that it is important to exercise great care in the handling of the assembly which is now at the temperature of liquid nitrogen, and insulated gloves should be worn to avoid freezing hands and fingers.

7. Place the assembly circuit board up in the palm of a gloved hand.

8. Using a small hammer, give a sharp rap to a side of the aluminum heat sink. This will produce a shear force to the bonding epoxy 16, which loses it's bonding strength as the temperature is lowered and the heat sink and the circuit card should be separated by the cleavage of this interface.

9. In the event the board 12 and the heat sink 14 are not separated the action of step 8, rap the heat sink harder on the opposite side and repeat this several times. It is very important that you ensure the assembly does not have time to warm up, since as the temperature rises, the epoxy will tend to be more tolerant of the shear stress being used to break it apart.

10. In the event the parts are not separated by the action of step 9, the whole assembly must be put back into the LN$_2$ to re-cool, and the entire process is repeated. It is possible that the process will have to be repeated several times.

Clearly, many modifications and variations of the present invention are possible in light of the above teachings and it is therefore understood, that within the inventive scope of the inventive concept, the invention may be practiced otherwise than specifically claimed.

What is claimed is:

1. A method for separating a silicon circuit board from a metal heat sink to which it is affixed by means of an epoxy, without damaging the circuit board or any electronic circuitry thereon, comprising the steps of:
   a. separating the assembly of said circuit board and said heat sink from any components on which it is mounted;
   b. filling a container with liquid nitrogen to a depth sufficient to completely immerse said assembly when said assembly is placed in the container;
   c. placing said assembly in said container, whereby said container is completely immersed in said liquid nitrogen;
   d. cooling the assembly in said liquid nitrogen until the boiling of the liquid nitrogen stops and said assembly is therefore at its lowest temperature;
   e. when the boiling of the liquid nitrogen stops, removing the assembly from the container; and
   f. supporting the assembly, and using a small hammer, giving a sharp rap to a side of the aluminum heat sink to produce a shear force to the bonding epoxy to break the bond between the circuit board and the heat sink.

2. The method of claim 1 and the further step of:
   g. in the event the circuit board and the heat sink are not separated through the actions of steps a to f, rapping the heat sink harder on the opposite side, and if necessary repeating this step g while said assembly is still cold.

3. The method of claim 2 and the further step of:
   h. in the event the circuit board and the heat sink are not separated by the actions of steps a to g, return the assembly into the container and repeating steps a to g until the bond is broken.

4. The method of claim 1 wherein said assembly is supported above the bottom of the container.

5. The method of claim 4, wherein said assembly is supported on dimples on the bottom of the container.

6. The method of claim 1, wherein said assembly is supported in step f in the palm of a gloved hand.

7. The method of claim 4 and the further step of:
   g. in the event the circuit board and the heat sink are not separated the action of step f, rapping the heat sink harder on the opposite side and repeating step g while said assembly is still cold.

8. The method of claim 7 and the further step of:
   h. in the event the circuit board and the heat sink are not separated by the actions of steps a to g, return the assembly into the container and repeating steps a to g until the bond is broken.

9. The method of claim 2 wherein said assembly is supported above the bottom of the container.

10. The method of claim 9, wherein said assembly is supported on dimples on the bottom of the container.

11. The method of claim 9 wherein said assembly is supported in step f in the palm of a gloved hand.

* * * * *